United States Patent
Baek et al.

(10) Patent No.: US 10,109,541 B2
(45) Date of Patent: Oct. 23, 2018

(54) BOARD FOR ELECTRONIC COMPONENT PACKAGE, ELECTRONIC COMPONENT PACKAGE, AND METHOD OF MANUFACTURING BOARD FOR ELECTRONIC COMPONENT PACKAGE

(71) Applicant: SAMSUNG ELECTRO-MECHANICS CO., LTD., Suwon-si, Gyeonggi-do (KR)

(72) Inventors: Yong Ho Baek, Suwon-si (KR); Jung Hyun Cho, Suwon-si (KR); Jae Hoon Choi, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/796,411

(22) Filed: Oct. 27, 2017

(65) Prior Publication Data

US 2018/0068911 A1  Mar. 8, 2018

Related U.S. Application Data

(62) Division of application No. 15/200,838, filed on Jul. 1, 2016, now Pat. No. 9,831,142.

(30) Foreign Application Priority Data

Nov. 6, 2015  (KR) .................. 10-2015-0155545

(51) Int. Cl.
*H01L 23/58* (2006.01)
*H01L 21/66* (2006.01)
(Continued)

(52) U.S. Cl.
CPC ............ *H01L 22/34* (2013.01); *H01L 21/565* (2013.01); *H01L 23/31* (2013.01);
(Continued)

(58) Field of Classification Search
CPC ... H01L 21/565; H01L 23/31; H01L 23/5226; H01L 24/16; H01L 24/48
(Continued)

(56) References Cited

U.S. PATENT DOCUMENTS 7,410,837 B2 * 8/2008 Tanaka ................ H01L 21/4846
174/260
8,022,524 B2 * 9/2011 Sato .................... H01L 25/0657
257/685

(Continued)

FOREIGN PATENT DOCUMENTS

| KR | 10-2009-0002573 A | 1/2009 |
| KR | 10-2014-0126125 A | 10/2014 |
| KR | 10-2015-0033937 A | 4/2015 |

OTHER PUBLICATIONS

U.S. Notice of Allowance dated Aug. 17, 2017 issued in U.S. Appl. No. 15/200,838.

*Primary Examiner* — Tan N Tran
(74) *Attorney, Agent, or Firm* — McDermott Will & Emery LLP

(57) ABSTRACT

A board for an electronic component package includes a wiring part on which an electronic component is disposed, wherein the wiring part includes an insulating layer, a signal transferring wiring electrically connected to the electronic component, and an electrical testing wiring electrically disconnected from the electronic component, and the electrical testing wiring includes conductive patterns formed on both surfaces of the wiring part, and conductive vias electrically connecting the conductive patterns to each other.

17 Claims, 11 Drawing Sheets

(51) Int. Cl.
*H01L 21/56* (2006.01)
*H01L 23/31* (2006.01)
*H01L 23/522* (2006.01)
*H01L 23/00* (2006.01)

(52) U.S. Cl.
CPC .......... *H01L 23/5226* (2013.01); *H01L 24/16* (2013.01); *H01L 24/48* (2013.01); *H01L 2224/16235* (2013.01); *H01L 2224/16238* (2013.01); *H01L 2224/32225* (2013.01); *H01L 2224/48105* (2013.01); *H01L 2224/48227* (2013.01); *H01L 2224/81005* (2013.01); *H01L 2924/00014* (2013.01); *H01L 2924/1533* (2013.01); *H01L 2924/15311* (2013.01)

(58) Field of Classification Search
USPC .................................................. 257/48, 698
See application file for complete search history.

(56) References Cited

U.S. PATENT DOCUMENTS

| | | | |
|---|---|---|---|
| 8,248,093 B2* | 8/2012 | Han | H01L 23/538 324/754.07 |
| 9,523,715 B2 | 12/2016 | Powell | |
| 2009/0008762 A1 | 1/2009 | Jung | |
| 2015/0084185 A1 | 3/2015 | Kim et al. | |

* cited by examiner

BOARD FOR ELECTRONIC COMPONENT PACKAGE, ELECTRONIC COMPONENT PACKAGE, AND METHOD OF MANUFACTURING BOARD FOR ELECTRONIC COMPONENT PACKAGE

CROSS-REFERENCE TO RELATED APPLICATION

This application is a divisional patent application of U.S. patent application Ser. No. 15/200,838, filed on Jul. 1, 2016, which claims benefit of the priority to Korean Patent Application No. 10-2015-0155545, filed on Nov. 6, 2015 with the Korean Intellectual Property Office, the disclosure of which is incorporated herein by reference.

BACKGROUND

The present disclosure relates to a board for an electronic component package, an electronic component package, and a method of manufacturing a board for an electronic component package.

TECHNICAL FIELD

An electronic component package is defined as package technology for electrically connecting an electronic component to a printed circuit board (PCB), such as a main board of an electronic device, or the like, and protecting the electronic component from external impacts. Meanwhile, one recent main trend in the development of technology related to electronic components is the reduction in size of electronic components. Therefore in a package field, in accordance with a rapid increase in a demand for miniaturized electronic components, or the like, the implementation of an electronic component package having a compact size and including a plurality of pins has been demanded.

One package technology suggested in order to satisfy the technical demands as described above is a wafer level package (WLP) using a redistribution wiring of an electrode pad of an electronic component formed on a wafer. An example of the wafer level package includes a fan-in wafer level package and a fan-out wafer level package. In particular, the fan-out wafer level package has a compact size and is advantageous in implementing a plurality of pins. Therefore, recently, the fan-out wafer level package has been actively developed.

SUMMARY

An aspect of the present disclosure may provide an electronic component package of which a structure is compact and manufacturing efficiency is significantly improved by allowing an electrical test for a wiring part to be performed before an electronic component is mounted.

Another aspect of the present disclosure may provide a method of manufacturing an electronic component package capable of efficiently manufacturing the electronic component package.

According to an aspect of the present disclosure, a board for an electronic component package may include: a wiring part on which an electronic component is disposed, wherein the wiring part includes an insulating layer, a signal transferring wiring electrically connected to the electronic component, and an electrical testing wiring electrically disconnected from the electronic component, and the electrical testing wiring includes conductive patterns formed on both surfaces of the wiring part, and conductive vias electrically connecting the conductive patterns to each other. An electrical test for the wiring part may be executed though an upper side of the wiring part using the electrical testing wiring.

According to another aspect of the present disclosure, an electronic component package may include: a wiring part; an electronic component disposed on the wiring part; and an encapsulant protecting the electronic component. The wiring part includes an insulating layer, a signal transferring wiring electrically connected to the electronic component, and an electrical testing wiring electrically disconnected from the electronic component, and the electrical testing wiring includes conductive patterns formed on both surfaces of the wiring part, and conductive vias electrically connecting the conductive patterns to each other.

According to another aspect of the present disclosure, a method of manufacturing a board for an electronic component package may include: forming a wiring part on a support, the wiring part including an insulating layer, a signal transferring wiring, and an electrical testing wiring, and the electrical testing wiring including conductive patterns formed on both surfaces of the wiring part, and conductive vias electrically connecting the conductive patterns to each other; performing an electrical test for the wiring part by applying an electrical signal to a conductive pattern formed on an upper surface of the wiring part; and electrically disconnecting the signal transferring wiring and the electrical testing wiring from each other such that the electrical testing wiring is electrically disconnected from an electronic component mounted on the wiring part and electrically connected to the signal transferring wiring.

According to another aspect of the present disclosure, an electronic component package may include a wiring part including a plurality of conductive patterns electrically connected to each other by vias penetrating through a plurality of insulating layers between the plurality of conductive wirings, and an electrical testing wiring electrically isolated from the plurality of conductive patterns, and an electronic component disposed on the wiring part, electrically connected to the plurality of conductive patterns of the wiring part, and electrically isolated from electrical testing wiring.

According to another aspect of the present disclosure, a method of an electronic component package may include forming a wiring part on a support, the wiring part including an insulating layer, a signal transferring wiring, and an electrical testing wiring, the electrical testing wiring electrically connected to the signal transferring wiring through a connection part, performing an electrical test of the wiring part by applying an electrical signal to a conductive pattern formed on an upper surface of the wiring part, mounting an electronic component on upper surface of the wiring part such that the electronic component is electrically connected to the signal transferring wiring, separating the support from the wiring part, and removing the connection part between the signal transferring wiring and the electrical testing wiring to electrically disconnect the signal transferring wiring and the electrical testing wiring from each other, such that the electrical testing wiring is electrically isolated from the electronic component.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
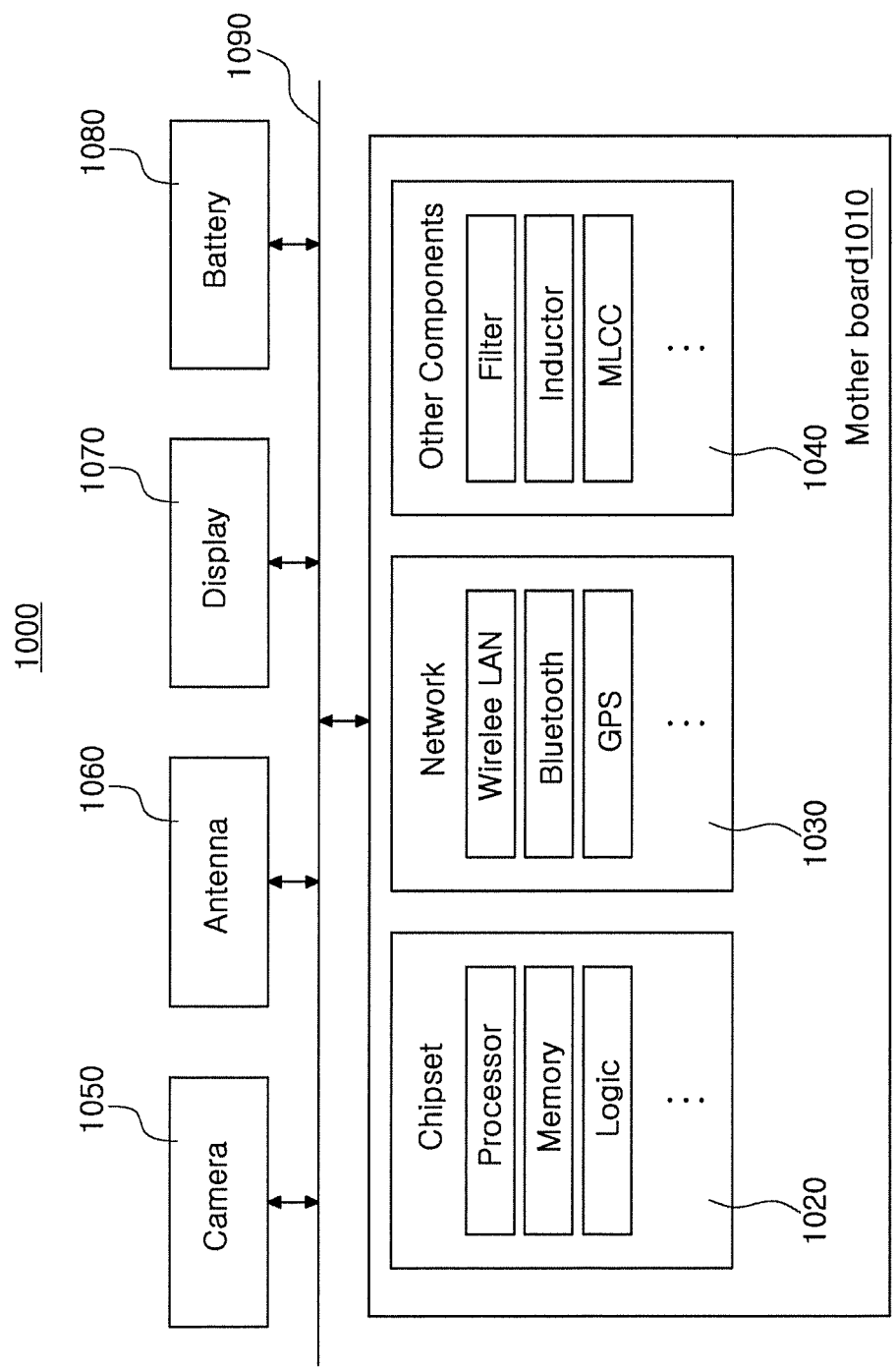
FIG. 1 is a block diagram schematically illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Electronic Device

FIG. 1 is a block diagram schematically illustrating an example of an electronic device system. Referring to FIG. 1, an electronic device 1000 may accommodate a mother board 1010 therein. Chip related components 1020, network related components 1030, other components 1040, and the like, may be physically and/or electrically connected to the mother board 1010. These components may be connected to other components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, etc.; an application processor chip such as a central processor (for example, a central processing unit (CPU)), a graphics processor (for example, a graphics processing unit (GPU)), a digital signal processor, a cryptographic processor, a micro processor, a micro controller, etc.; a logic chip such as an analog-to-digital converter, an application-specific integrated circuit (ASIC), etc.; and the like. However, the chip related components 1020 are not limited thereto, and may also include other types of chip related components. In addition, these components 1020 may be combined with each other.

The network related components 1030 may include protocols such as wireless fidelity (Wi-Fi) (Institute of Electrical and Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols and any other wireless and wired protocols designated after the above-mentioned protocols. However, the network related components 1030 are not limited thereto, and may also include any of a plurality of other wireless or wired standards or protocols. In addition, these components 1030 may be combined with each other together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, these components 1040 may be combined with each other together with the chip related components 1020 and/or the network related components 1030 described above.

The electronic device 1000 may include other components that may or may not be physically and/or electrically connected to the mother board 1010 depending on a kind thereof. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage (for example, a hard disk drive) (not illustrated), a compact disk (CD) (not illustrated), a digital versatile disk (DVD) (not illustrated), and the like. However, these other components are not limited thereto, and may also include other components used for various purposes depending on a kind of electronic device 1000.

The electronic device 1000 may be a smartphone, a personal digital assistant, a digital video camera, a digital still camera, a network system, a computer, a monitor, a tablet, a laptop, a netbook, a television, a video game console, a smart watch, or the like. However, the electronic device 1000 is not limited thereto, and may also be any other electronic device processing data.

Figure 2:
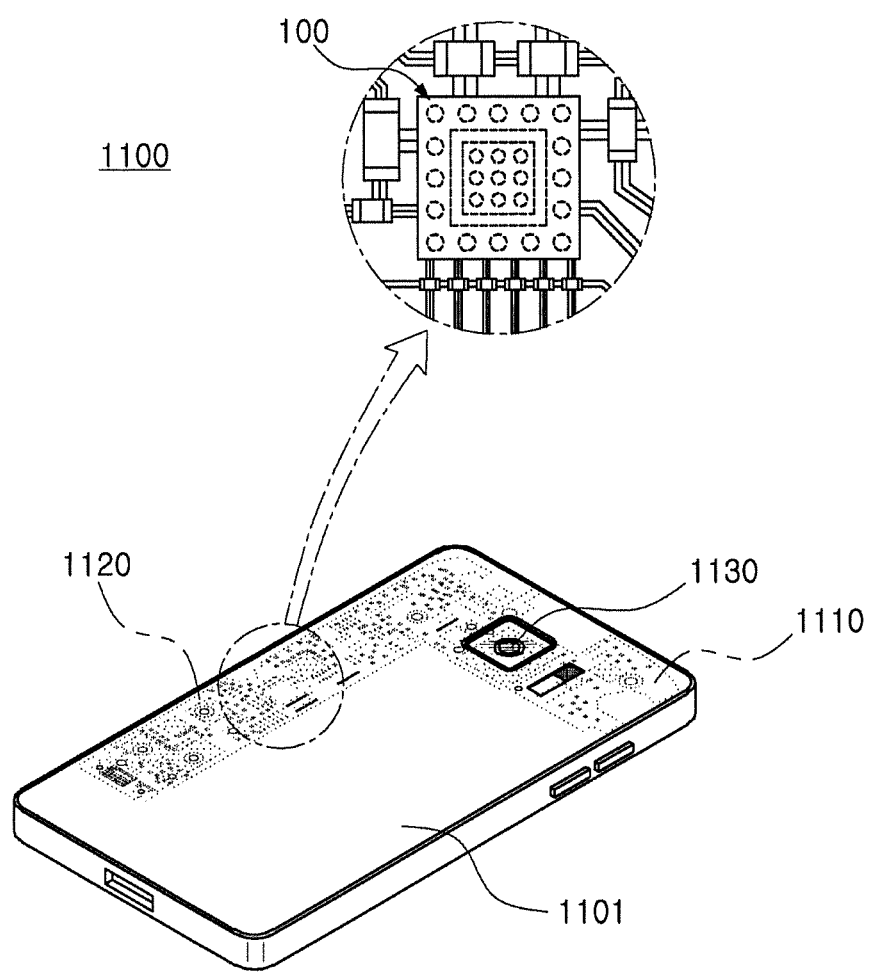
FIG. 2 is a view schematically illustrating an example of an electronic component package used in an electronic device.

FIG. 2 is a view schematically illustrating an example of an electronic component package used in an electronic device. The electronic component package may be used for various purposes in the various electronic devices 1000 as described above. For example, a main board 1110 may be accommodated in a body 1101 of a smartphone 1100, and various electronic components 1120 may be physically and/or electrically connected to the main board 1110. In addition, another component that may be or may not be physically and/or electrically connected to the main board 1110, such as a camera 1130, may be accommodated in the body 1101. Here, some of the electronic components 1120 may be the chip related components as described above, and the electronic component package 100 may be, for example, an application processor among the chip related components, but are not limited thereto.

Electronic Component Package and Method of Manufacturing the Same

Figure 3:
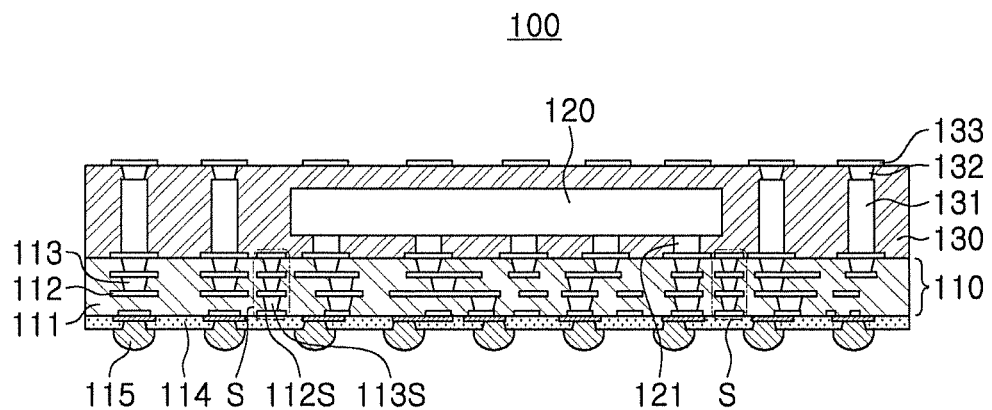
FIG. 3 is a cross-sectional view schematically illustrating an example of an electronic component package.

FIG. 3 is a cross-sectional view schematically illustrating an example of an electronic component package. An electronic component package 100 according to the present exemplary embodiment may include an electronic component 120 disposed on aboard of the electronic component package and an encapsulant 130 electrically connected to the electronic component 120 and protecting the electronic component 120. In this case, the board of the electronic component package may include a wiring part 110 as a main component thereof.

The wiring part 110 may include insulating layers 111, conductive patterns 112, and conductive vias 113, and may include signal transferring wirings electrically connected to the electronic component 120 and electrical testing wirings S electrically disconnected from the electronic component 120. In this case, both of the signal transferring wirings and the electrical testing wirings S may include the conductive patterns 112 and the conductive vias 113 of the wiring part 110. The conductive patterns 112 and the conductive vias 113 of the wiring part 110 included in the electrical testing wirings S among conductive patterns 112 and the conductive vias 113 of the wiring part 110 are denoted by conductive patterns 112S and conductive vias 113S.

The electrical testing wirings S may include the conductive patterns 112S formed on both surfaces of the wiring part 110 and the conductive vias 113S electrically connecting the conductive patterns 112S to each other, and may be provided in order to perform an electrical test of the wiring part 110 as described below. Although a case in which the wiring part 110 has a multilayer structure has been described in the electronic component package 100 according to an example, the wiring part 110 may also be formed of a single layer, if necessary. In addition, the wiring part 110 may also have more layers than the single layer, depending on design particulars.

An insulating material that may be contained in the insulating layer 111 may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, such as pre-preg, Ajinomoto build-up film (ABF), FR-4, bismaleimide triazine (BT), or the like. In addition, in a case in which a photo-imagable dielectric (PID) is used as the insulating material, the insulating layer 111 may be formed at a more reduced thickness, and a fine pattern may be more easily implemented. The insulating layers 111 forming respective layers in the wiring part 110 may be formed of the same material or may be formed of different materials, if necessary. Thicknesses of the insulating layers 111 are also not particularly limited. For example, thicknesses of the insulating layers 111 except for the conductive patterns 112 may be about 5 μm to 20 μm, and thicknesses of the insulating layers 111 when considering thicknesses of the conductive patterns 112 may be about 15 μm to 70 μm.

The conductive patterns 112 and 112S may also serve as a wiring pattern and/or a pad pattern, and an electrically conductive material such as copper (Cu), aluminum (Al), silver (Ag), tin (Sn), gold (Au), nickel (Ni), lead (Pd), or alloys thereof, may be used as materials of the conductive patterns 112 and 112S. The conductive patterns 112 may perform various functions depending on a design of the corresponding layer. For example, the conductive patterns 112 may serve as a ground (GND) pattern, a power (PWR) pattern, a signal (S) pattern, and the like, as redistribution patterns. Here, the signal (S) pattern may include various signals except for the ground (GND) pattern, the power (PWR) pattern, and the like, for example, data signals, and the like. In addition, the conductive patterns 112 may serve as a via pad, an external connection terminal pad, and the like, as pad patterns. Thicknesses of the conductive patterns 112 are also not particularly limited, and may be, for example, about 10 μm to 50 μm.

Meanwhile, a surface treatment layer may be further formed on conductive patterns 112 and 112S exposed to externally from the insulating layers 111, for example, conductive patterns 112 and 112S to which the electronic component 120 is connected, if necessary. The surface treatment layer is not particularly limited as long as it is known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The conductive vias 113 and 113S may electrically connect the conductive patterns 112 and 112S, electrode pads 121, and the like, formed on different layers to each other, thereby forming an electrical path within the electronic component package 100. A conductive material such as copper (Cu), aluminum (Al), silver (Ag), tin (Sn), gold (Au), nickel (Ni), lead (Pd), or alloys thereof, may be used as materials of the conductive vias 113 and 113S. The conductive vias 113 and 113S may also be completely filled with a conductive material. Alternatively, a conductive material may be formed along walls of the conductive vias 113 and 113S. In addition, the conductive vias 113 and 113S may have all of the shapes known in the related art, such as a tapered shape in which a diameter of the via becomes smaller toward a lower surface, a reverse tapered shape in which a diameter of the via becomes larger toward a lower surface, a cylindrical shape, and the like.

As described above, the electrical testing wirings S may include the conductive patterns 112S and the conductive vias 113S of the wiring part 110, and may be included in the board in a state in which they are electrically disconnected from the electronic component 120, that is, in a state in which they are not electrically connected to the electronic component 120. In addition, the conductive patterns 112S belonging to the electrical testing wirings S may be electrically disconnected from the conductive patterns 112 belonging to the signal transferring wirings. The conductive patterns 112S included in the electrical testing wirings S may be formed on both surfaces of the wiring part 110, that is, upper and lower surfaces of the wiring part 110 in FIG. 3. The purpose of this form may be to perform the electrical test through the upper portion of the wiring part 110 in a state in which a support is coupled to a lower portion of the wiring part 110. This will be described in more detail in a description of a method of manufacturing an electronic component package to be described above.

Figure 4:
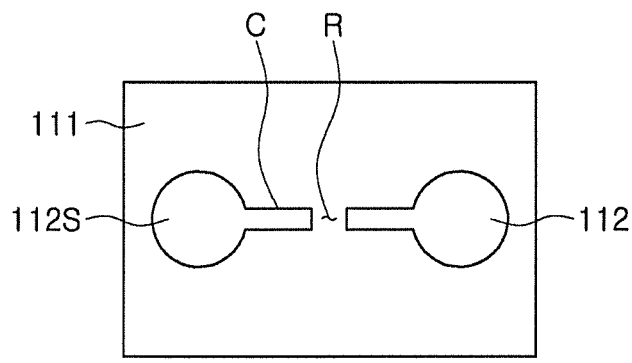
FIG. 4 is a plan view schematically illustrating a shape of an electrical testing wiring in FIG. 3.

Some conductive patterns 112S of the conductive patterns of the electrical testing wirings S to perform the electrical test of the wiring part 110 may be formed on a lower surface of the wiring part 110, and may have a form in which they do not belong to the conductive patterns 112 belonging to the signal transferring wirings, that is, a form in which they are disconnected from the conductive patterns 112 belonging to the signal transferring wirings, as illustrated in FIG. 3. This electrical disconnection structure is illustrated in more detail in FIG. 4. FIG. 4 is a plan view schematically illustrating a shape of an electrical testing wiring in FIG. 3. The electrical testing wiring S may include a conductive pattern 112S having a shape of a daisy chain in order to perform the electrical test. Since the daisy chain is adopted in order to perform the electrical test rather than to use a package, the daisy chain needs to be removed after the electrical test. As illustrated in FIG. 4, a connection part C connecting the electrical testing wiring S and another conductive pattern 112 adjacent to the electrical testing wiring S to each other may be one of conductive patterns formed on the lowermost surface of the wiring part 110, and may correspond to a testing connection pattern connecting at least two conductive vias 113 to each other. The connection part C may be disconnected after an electrical test, thereby forming a disconnected region R. As a result, the electrical testing wiring S that is not connected to the electronic component 120 may be obtained.

As in the present exemplary embodiment, the wiring part 110 may separately include the electrical testing wirings S, and thus the electrical test may be performed through an upper portion of the wiring part 110 before the electronic component 120 is mounted, and unnecessary consumption of the electronic component 120 that is relatively expensive may be reduced. That is, in a scheme according to the related art in which the electrical test is performed after the electronic component 120 is disposed, even if a defect is generated in the wiring part rather than the electronic component, there was a problem that the electronic component may not be used. The present inventors have intended to solve this problem. Further, even in a case in which the electrical test is performed before the electronic component is disposed, it was difficult to apply electrical signals to upper and lower portions of the wiring part 110 due to the support required in a process of manufacturing the wiring part 110. Therefore, the present inventors have allowed the electrical test to be performed through the upper portion of the wiring part 110 even in a state in which the support is disposed by using the electrical testing wirings S described above.

The electronic component 120 may be various active components (for example, a diode, a vacuum tube, a transistor, and the like) or passive components (for example, an inductor, a condenser, a resistor, and the like). Alternatively, the electronic component 120 may be an integrated circuit (IC) chip indicating a chip in which hundreds of to millions of or more elements are integrated. The electronic component 120 may be an electronic component in which an integrated circuit is packaged in a flip-chip form, if necessary. The integrated circuit chip may be an application processor chip such as a central processor (such as a CPU), a graphic processor (such as a GPU), a digital signal processor, a cryptographic processor, a micro processor, a micro controller, or the like, but is not limited thereto. In this case, although one electronic component 120 is illustrated in FIG. 3, two or more electronic components may also be used.

The electronic component 120 may include the electrode pads 121 electrically connected to the wiring part 110. The purpose of the electrode pad 121 may be to electrically connect the electronic component 120 externally, and a material of the electrode pad 121 is not particularly limited as long as it is a conductive material. The conductive material may be copper (Cu), aluminum (Al), silver (Ag), tin (Sn), gold (Au), nickel (Ni), lead (Pd), or alloys thereof, but is not limited thereto. The electrode pads 121 may be redistributed by the wiring part 110, and the wiring part 110 may be divided into first and second wiring parts for the purpose of redistribution as in an exemplary embodiment to be described below. The electrode pad 121 may have an embedded form or a protruding form. In addition, the conductive pattern 112 positioned at the uppermost portion of the wiring part 110 connected to the electronic component 120 may have a form in which it is formed on an upper surface of the insulating layer 111, as illustrated in FIG. 3, or a form in which it is embedded in the insulating layer 111, that is, a form in which it does not protrude from the insulating layer 111.

In a case in which the electronic component 120 is the integrated circuit chip, the electronic component 120 may have a body (not denoted by a reference number), a passivation layer (not denoted by a reference number), and the electrode pads 121. The body may be formed on the basis of, for example, an active wafer. In this case, silicon (Si), germanium (Ge), gallium arsenide (GaAs), or the like, may be used as a basic material of the body. The passivation layer may serve to protect the body from external factors, and may be formed of, for example, an oxide layer, a nitride layer, or the like, or be formed of a double layer of an oxide layer and a nitride layer. A conductive material such as copper (Cu), aluminum (Al), silver (Ag), tin (Sn), gold (Au), nickel (Ni), lead (Pd), or alloys thereof, may be used as a material of the electrode pad 121. A layer on which the electrode pads 121 are formed may become an active layer.

A thickness of the electronic component 120 in a cross section thereof is not particularly limited, and may be changed depending on a kind of electronic component 120. For example, in a case in which the electronic component is the integrated circuit chip, a thickness of the electronic component may be about 100 μm to 480 μm, but is not limited thereto.

Meanwhile, as illustrated in FIG. 3, at least one conductive post 131 may be disposed on the wiring part 110. In the present exemplary embodiment, a structure in which a plurality of conductive posts 131 are provided has been used. The conductive post 131 may serve to transfer an electrical signal applied to an upper portion of the electronic component package 100 to the wiring part 110, and is not necessarily required in the present exemplary embodiment. As illustrated in FIG. 3, the plurality of conductive posts 131 may be disposed at an outer side of the wiring part 110 so as to enclose the electronic component 120. The conductive posts 131 may serve as an electrical connection path when another electronic component is disposed above the electronic component 120 or an external electrical signal is applied through the upper portion, and may contain a material having high electrical conductivity, such as copper, silver, or the like. In this case, as illustrated in FIG. 3, conductive vias 132 or conductive patterns 133 may be formed above the conductive posts 131 in order to connect the electronic component 120 to another electronic component, or the like, disposed above the electronic component 120.

The encapsulant 130 may protect the electronic component 120 and the conductive post 131. For example, the encapsulant 130 may encapsulate the electronic component 120 and the conductive post 131. A form in which the encapsulant 130 encapsulates the electronic component 120 and the conductive post 131 is not particularly limited, and may be a form in which the encapsulant 130 encloses at least portions of the electronic component 120 and the conductive post 131. Here, the meaning that the encapsulant 130 encloses a target component is that the encapsulant 130 does not directly contact the target component due to a separate component interposed between the encapsulant 130 and the target component as well as that the encapsulant 130 directly covers the target component.

A material of the encapsulant 130 is not particularly limited as long as the encapsulant may serve to protect the electronic component 120 and the conductive post 131. For example, a thermosetting resin such as an epoxy resin, a thermoplastic resin such as a polyimide resin, a resin having a reinforcement material such as a glass fiber or an inorganic filler impregnated in the thermosetting resin and the thermoplastic resin, such as pre-preg, ABF, FR-4, ET, a PID resin, or the like, may be used as a material of the encapsulant 130. In addition, as described below, the encapsulant 130 may be obtained by a method of stacking a resin film in a non-hardened state on the wiring part 110 and then hardening the resin film. The encapsulant 130 may be obtained by the known molding method such as a method of using an epoxy molding compound (EMC), or the like, in addition to the above-mentioned method.

Meanwhile, the encapsulant 130 may contain conductive particles in order to block electromagnetic waves, if necessary. For example, the conductive particle may be any material that may block electromagnetic waves, such as copper (Cu), aluminum (Al), silver (Ag), tin (Sn), gold (Au), nickel (Ni), lead (Pd), solder, or the like, but is not particularly limited thereto.

The electronic component package may further include an outer layer 114 disposed beneath the wiring part 110 and capable of protecting the wiring part 110 from an external physical or chemical influence, or the like. In this case, the outer layer 114 may have opening parts exposing at least portions of the conductive patterns 112 of the wiring part 110. A material of the outer layer 114 is not particularly limited. For example, a solder resist may be used as a material of the outer layer 140. In addition, the same material as that of the insulating layer 111 of the wiring part 110 may be used as a material of the outer layer 140, and the outer layer 114 is generally formed of a single layer, but may also be formed of multiple layers, if necessary.

The electronic component package 100 may include connection terminals 115 disposed at the lowermost portion thereof. The purpose of the connection terminals 115 may be to physically and/or electrically externally connect the electronic component package 100. For example, the electronic component package 100 may be mounted on the main board of the electronic device through the connection terminals 115. The connection terminals 115 may be connected to the conductive patterns 112 through the opening parts formed in the outer layer 114. Therefore, the connection terminals 115 may also be electrically connected to the electronic component 120. The connection terminal 115 may be formed of a conductive material, such as copper (Cu), aluminum (Al), silver (Ag), tin (Sn), gold (Au), nickel (Ni), lead (Pd), solder, or the like, but is not particularly limited thereto. The connection terminal 115 may be a land, a ball, a pin, or the like. The connection terminal 115 may be formed of multiple layers or a single layer. In a case in which the connection terminal 115 is formed of multiple layers, the connection terminal 115 may contain a copper pillar and a solder, and in a case in which the connection terminal 115 is formed of a single layer, the connection terminal 115 may contain a tin-silver solder or copper. However, this is only an example, and the connection terminal 115 is not limited thereto.

Meanwhile, some of the external connection terminals 115 may be disposed in a fan-out region. The fan-out region is defined as a region except for a region in which the electronic component is disposed. That is, the electronic component package 100 according to an example may be a fan-out package. The fan-out package may have reliability greater than that of a fan-in package, may implement a plurality of I/O terminals, and may easily perform 3D interconnection. In addition, since the fan-out package may be mounted on the electronic device without using a separate substrate as compared to a ball grid array (BGA) package, a land grid array (LGA) package, or the like, the fan-out package may be manufactured at a reduced thickness, and may have excellent price competitiveness.

The number, an interval, a disposition form, and the like, of connection terminals 115 are not particularly limited, and may be sufficiently modified depending on design particulars by those skilled in the art. For example, the number of connection terminals 115 may be several ten to several thousand depending on the number of electrode pads 121 of the electronic component 120. However, the number of connection terminals 115 is not limited thereto, and may also be several ten to several thousand or more or several ten to several thousand or less.

Hereinafter, a board of an electronic component package and a method of manufacturing an electronic component package according to an exemplary embodiment in the present disclosure will be described. The structure of the electronic component package according to the above-mentioned exemplary embodiment or a modified example may be more clearly understood through a description of a method of manufacturing an electronic component package.

FIGS. 5 through 12 are views schematically illustrating a board for an electronic component package and a method of manufacturing an electronic component package using the same according to an exemplary embodiment in the present disclosure.

Figure 5:
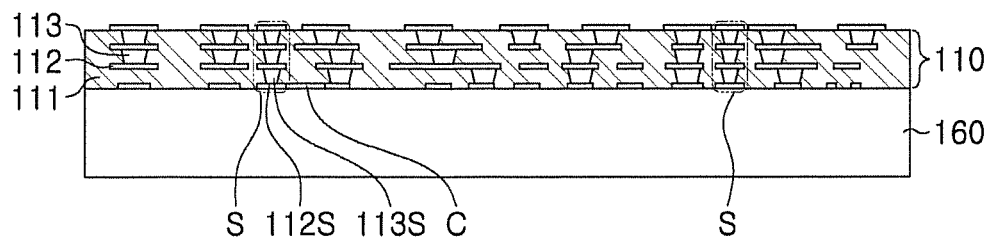
FIGS. 5 through 12 are views schematically illustrating a board for an electronic component package and a method of manufacturing an electronic component package using the same according to an exemplary embodiment in the present disclosure.

First, as illustrated in FIG. 5, the wiring part 110 may be formed on a support 160. The purpose of the support 160 may be to handle the wiring part 110 having a relatively reduced thickness, and a material of the support 160 is not particularly limited as long as it may support the wiring part 110. The support 160 may have a multilayer structure, and may include a release layer, a metal layer, and the like, so as to be easily removed from the wiring part 110 in a subsequent process. In the present exemplary embodiment, an electrical test of the wiring part 110 may be performed in a state in which the support 160 is coupled to the wiring part 110. To this end, the uppermost portion of the support 160 may be formed of a material having an electrical insulation property.

The insulating layer 111, the conductive patterns 112, and the conductive vias 113 of the wiring part 110 may be formed depending on intended shapes, and a process of forming the insulating layer 111, the conductive patterns 112, and the conductive vias 113 may be repeated the required number of times. In detail, the insulating layer 111 may be formed by a known method, such as a method of laminating a precursor of the insulating layer 111 and then hardening the precursor, a method of applying a material for forming the insulating layer 111 and then hardening the material, or the like. As the method of laminating the precursor, a method of performing a hot press process of pressing the precursor for a predetermined time at a high temperature, decompressing the precursor, and then cooling the precursor to a room temperature, cooling the precursor in a cold press process, and then separating a work tool, or the like, may be used. As the method of applying the material, for example, a screen printing method of applying ink by squeeze, a spray printing method of applying ink in a mist form, or the like, may be used. The hardening process, which is a post-process, may be a process of drying the material so as not to be completely hardened in order to use a photolithography method, or the like.

The conductive patterns 112 and the conductive vias 113 may also be formed by the known method. First, via holes (not illustrated) may be formed using the mechanical drill and/or the laser drill described above. Alternatively, the via holes may also be formed by a photolithography method in a case in which the insulating layer 111 contains the PID, or the like. The conductive patterns 112 and the conductive vias 113 may also be formed by electrolytic copper plating, electroless copper plating, or the like, using a dry film pattern.

As described above, in the present exemplary embodiment, the conductive patterns 112S and the conductive vias 113S may form the electrical testing wirings S. However, the electrical testing wirings S may be in a state in which they are connected to other conductive patterns 112 and conductive vias 113 in order to perform an electrical test for the wiring part 110 unlike a final structure. These connection parts C connected to the electrical testing wirings S may be formed beneath the wiring part 110, as illustrated in FIG. 5. In a case in which the connection parts C are formed beneath the wiring part 110, a short-circuit process for electrically disconnecting the electrical testing wirings S from the electronic component 120 may be easily executed in a subsequent process.

Figure 6:
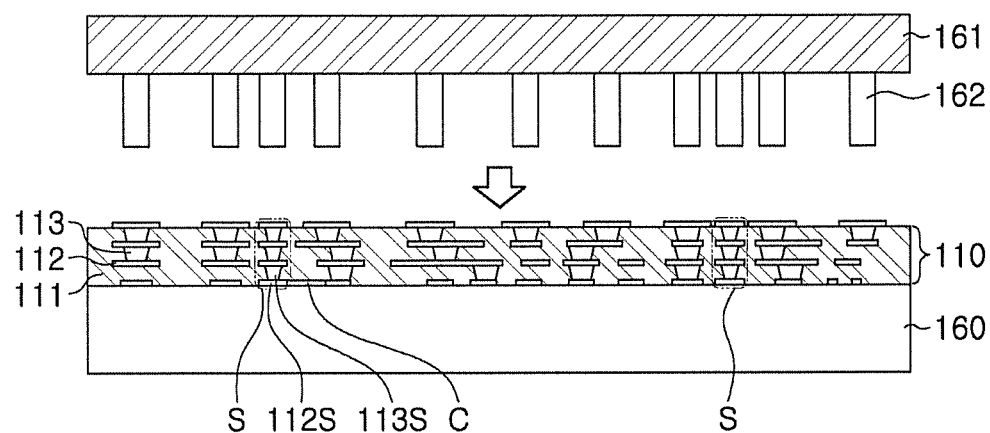

Next, as illustrated in FIG. 6, it may be confirmed whether or not a defect is present in the wiring part 110 in terms of electrical connection. To this end, a testing jig 161 may be connected to the conductive patterns 112 on the wiring part 110. In this case, the testing jig 161 may include a plurality of tips 162. The plurality of tips 162 may be disposed at positions corresponding to at least some of the conductive patterns 112 on the wiring part 110.

As described above, the electrical testing wirings S provided in order to perform the electrical test may be in a state in which they are electrically connected to the conductive patterns 112 and the conductive vias 113 to be connected to the electronic component, and the conductive patterns 112S of the electrical testing wirings S may be formed on the wiring part 110. Due to this structure, even in a case in which an electrical signal is not applied to the upper and lower portions of the wiring part 110, that is, even in a state in which the support 160 is coupled to the wiring part 110, the electrical test may be performed through only the conductive patterns 112 disposed on an upper surface of the wiring part 110, and the present test process may be executed before the electronic component is mounted. The wiring part 110 determined to be unsatisfactory in the present test process may be discarded or reused for another purpose, and a subsequent process is not performed on the wiring part 110 determined to be unsatisfactory, and thus a process cost may be reduced.

Figure 7:
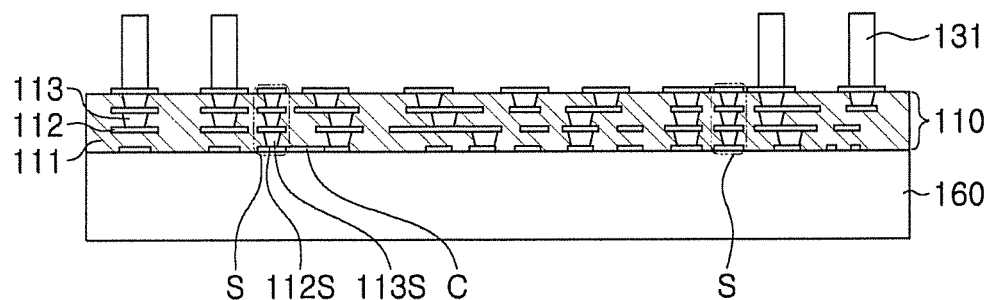

Next, as illustrated in FIG. 7, the conductive posts 131 having a pillar shape may be formed on the wiring part 110. The conductive posts 131 may be electrically connected to the conductive patterns 112 and the conductive vias 113 of the wiring part 110. As described above, the conductive post 131 may be formed of a material such as copper, silver, or the like, and may be formed of an appropriate plating method. As a method of forming the conductive post 131, another method may be used in addition to the plating method. For example, a method of bonding a structure having a pillar shape to the wiring part 110 may be considered.

Meanwhile, the electrical testing process described above may also be executed after the conductive posts 131 are formed. That is, before the electronic component 120 is mounted on the wiring part 110, the electrical test for the wiring part 110 and the conductive posts 131 may be performed to check whether or not a defect is generated in the wiring part 110 and the conductive posts 131 at a time.

Figure 8:
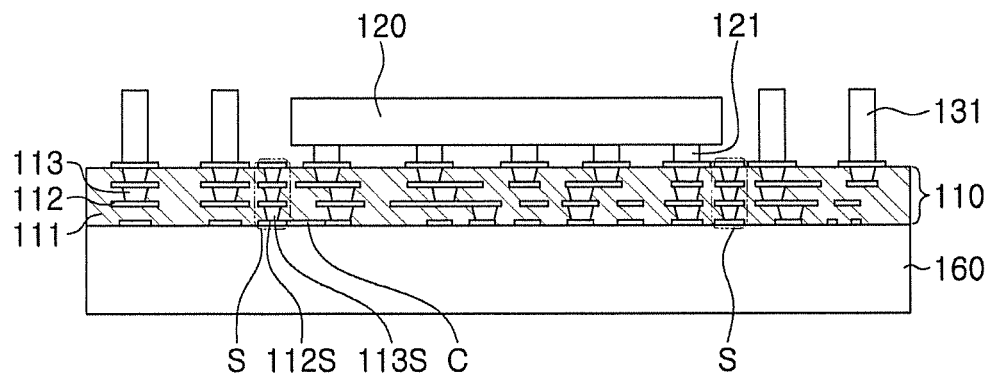

Next, as illustrated in FIG. 8, the electronic component 120 may be disposed on the wiring part 110, and may be electrically connected to the wiring part 110. In this case, a position at which the electronic component 120 is disposed is not particularly limited. However, it may be preferable that the electronic component 120 is mounted on the wiring part 110 in a state in which it is not connected to the electrical testing wirings S. In addition, in a case in which the electrical testing wirings S are positioned directly beneath the electronic component 120, the electrical testing wirings S may be unintentionally connected to the electronic component 120. Therefore, it may be preferable that a position at which the electronic component 120 is mounted is adjusted so that the electrical testing wirings S are positioned in the vicinity of the electronic component 120. Meanwhile, as described above, the electronic component 120 may be disposed to be enclosed by the plurality of conductive posts 131. In order to provide a stable mounting structure, a conductive adhesion material may be used between the electrode pads 121 of the electronic component 120 and the conductive patterns 112 of the wiring part 110.

Figure 9:
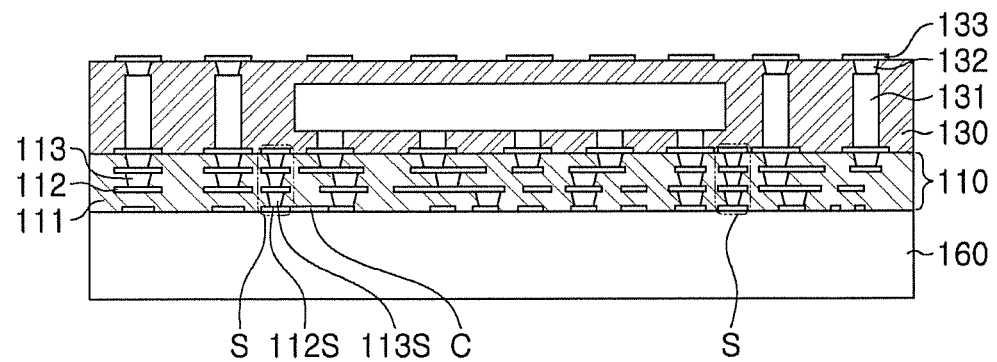

Next, as illustrated in FIG. 9, the encapsulant encapsulating the electronic component 120 and the conductive posts 131 may be formed. As an example of a method of forming the encapsulant 130, a method of stacking a resin film in a non-hardened state on the wiring part 110 and then hardening the resin film may be used. In this case, a metal thin film may be formed on a surface of the resin film, that is, an upper surface of the resin film in FIG. 8. The metal thin film may be used to later form a wiring pattern. As a specific example of the resin film, a resin coated copper (RCC) may be used. After the encapsulant 130 is formed, the conductive vias 132 and the conductive patterns 133 may be formed to be connected to the conductive posts 131. Detailed contents of a process of forming the conductive vias 132 and the conductive patterns 133 will be described below.

Figure 10:
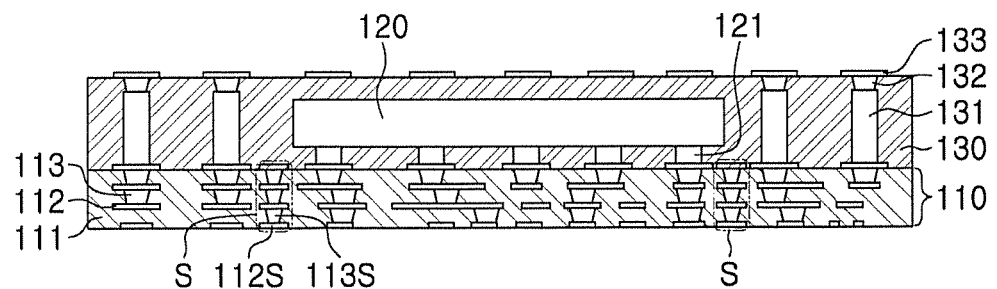

Next, as illustrated in FIG. 10, the support 160 may be separated from the wiring part 110. In this case, an etching process, a desmear process, or the like, used in the related art may be appropriately utilized. In addition, as described above, testing connection patterns, that is, the connection parts C, may be disconnected in order to electrically isolate the electrical testing wirings S. This disconnection process will be described in detail with reference to FIG. 11.

Figure 11:
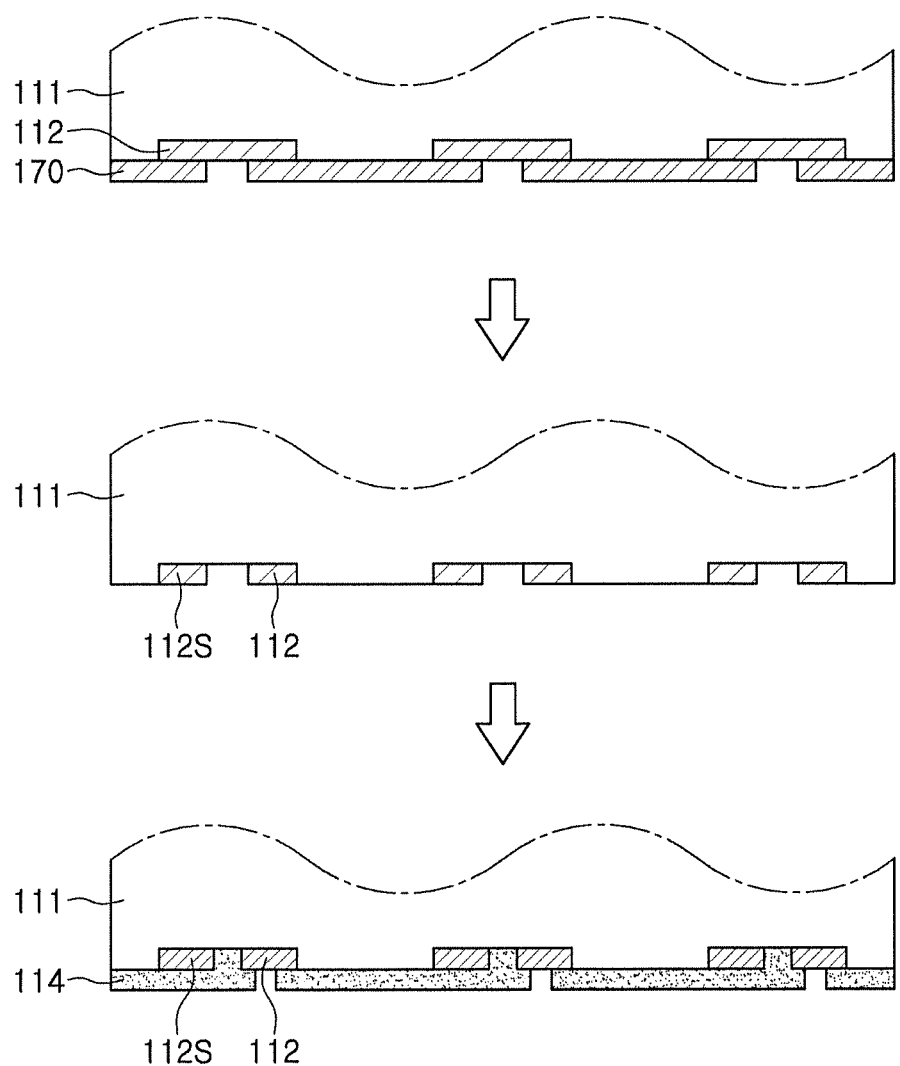

As illustrated in FIG. 11, after the conductive patterns 112 are exposed by the etching process, the desmear process, or the like, described above, a mask layer 170 such as a dry film photo-resist (DFR) film may be formed. The mask layer 170 may have a form in which regions to be disconnected are opened. The conductive patterns 112 may be etched through this open region to disconnect the connection parts, thereby forming disconnected regions that may electrically isolate the electrical testing wirings S. Therefore, an originally intended wiring form may be obtained.

Then, the outer layer 114 covering the conductive patterns 112 may be formed. The outer layer 114 may cover the conductive patterns 112S included in the electrical testing wirings S so as not to be externally exposed, and may have the opening parts exposing at least portions of the conductive patterns 112 connected to the electronic component 120.

The outer layer 114 may be formed by a method of laminating a precursor of the outer layer 114 and then hardening the precursor, a method of applying a raw material for forming the outer layer 114 and then hardening the raw material, or the like. Then, the opening parts may be formed in the outer layer 114, and the connection terminals 115 described with reference to FIG. 3 may be formed to fill in the opening parts. A method of forming the connection terminals 115 is not particularly limited. That is, the connection terminals 115 may be formed by a method well known in the related art depending on a structure or a form of the connection terminals 115. The connection terminals 115 may be fixed by reflow, portions of the connection terminals 115 may be embedded in the outer layer 114 in order to enhance fixing force, and the remaining portions of the connection terminals 115 may be externally exposed, whereby reliability may be improved.

Figure 12:
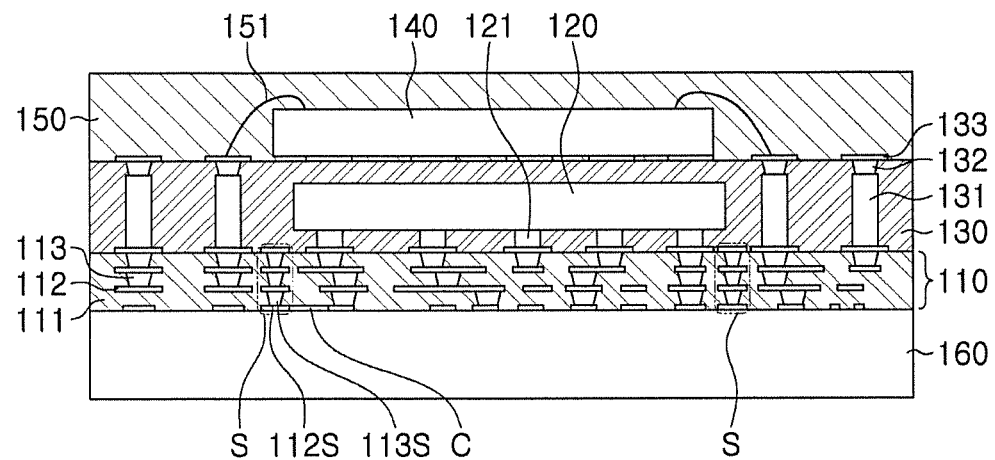

Meanwhile, as a modified example, as illustrated in FIG. 12, an additional electronic component 140 may be disposed on the encapsulant 130, and an additional encapsulant 150 covering the additional electronic component 140 may be formed, whereby a package-on-package (POP) structure may be obtained. Hereinafter, in order to distinguish the electronic component 120 and the additional electronic component 140 from each other and distinguish the encapsulant 130 and the additional encapsulant 150 from each other, the electronic component 120 will be referred to as a first electronic component, the additional electronic component 140 will be referred to as a second electronic component, the encapsulant 130 will be referred to as a first encapsulant, and the additional encapsulant 150 will be referred to as a second encapsulant, if necessary.

The second electronic component 140 may be various active components or passive components, similar to the first electronic component 120, and may be, for example, a memory element, or the like. As described above, the second electronic component 140 may be electrically connected to the conductive posts 131. Although connection between the second electronic component and the conductive posts 131 through wires 151 has been illustrated in FIG. 12, the connection between the second electronic component and the conductive posts 131 through the wires 151 is only an example. That is, the second electronic component and the conductive posts 131 may be connected to each other by another connection method, for example, a flip-chip bonding method, or the like. In addition, although one electronic component 120 has been illustrated in FIG. 3, two or more electronic components may also be used.

The second encapsulant 150 may encapsulate the second electronic component 140 in order to protect the second electronic component 140, similar to the first encapsulant 130. In this case, as seen from a form illustrated in FIG. 12, the first encapsulant 130 and the second encapsulant 150 may contact each other. In detail, an upper surface of the first encapsulant 130 and a lower surface of the second encapsulant 150 may contact each other in at least a partial region, and by this structure a compact package structure may be obtained even in a case in which a plurality of electronic components are used. A material of the second encapsulant 150 is not particularly limited as long as the second encapsulant 150 may perform this function. For example, the second encapsulant 150 may be formed by EMC molding using an insulating resin. In addition, the second encapsulant 150 may also be formed of the same material as that of the first encapsulant 130. Further, the second encapsulant 150 may be obtained by the same method as the method of forming the first encapsulant 130, for example, the method of stacking the resin film in the non-hardened state.

Meanwhile, the present process of mounting the additional electronic component 140 may be executed in a state in which the support 160 is coupled to the wiring part 110, as illustrated in FIG. 12, or may be executed in a state in which the support 160 is separated from the wiring part 110. In addition, before the second electronic component 140 is mounted, the electrical test may be performed once more through the conductive patterns 133 on the encapsulant 130, and in the state in which the support 160 is separated from the wiring part 110, the electrical test may be performed using both of the conductive patterns 133 on the encapsulant 130 and the conductive pattern 112 beneath the wiring part 110. In a subsequent process, the above-mentioned processes may be used, thereby appropriately completing a POP structure.

Hereinafter, another example of a method of manufacturing an electronic component package suggested in the present disclosure will be described. FIGS. 13 through 18 are views schematically illustrating a method of manufacturing an electronic component package according to another exemplary embodiment in the present disclosure. The method of manufacturing an electronic component package according to the present exemplary embodiment is mainly different from the method of manufacturing an electronic component package according to the exemplary embodiment described above in that two wiring parts having different characteristics are used. However, a technical spirit that is not opposite to that of the exemplary embodiment described above in contents that will be described in association with a method of manufacturing an electronic component package below may also be adopted in the exemplary embodiment described above.

Figure 13:
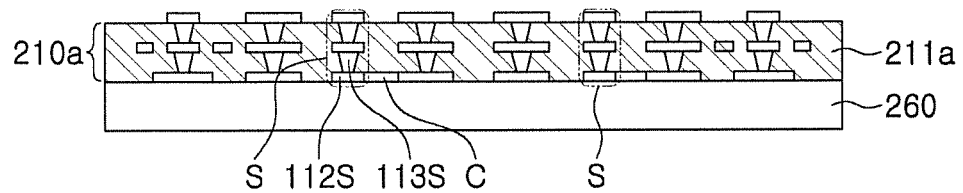
FIGS. 13 through 18 are views schematically illustrating a method of manufacturing an electronic component package according to another exemplary embodiment in the present disclosure.

First, as illustrated in FIG. 13, a first wiring part 210a may be formed on a support 260. The first wiring part 210a may include an insulating layer 211a, conductive patterns 212a (see FIG. 14), and conductive vias 213a (see FIG. 14). In this case, the first wiring part 210a may include electrical testing wirings S for performing an electrical test. Since the first wiring part 210a may be obtained by the method described in the exemplary embodiment described above, an overlapping description will be omitted.

Figure 14:
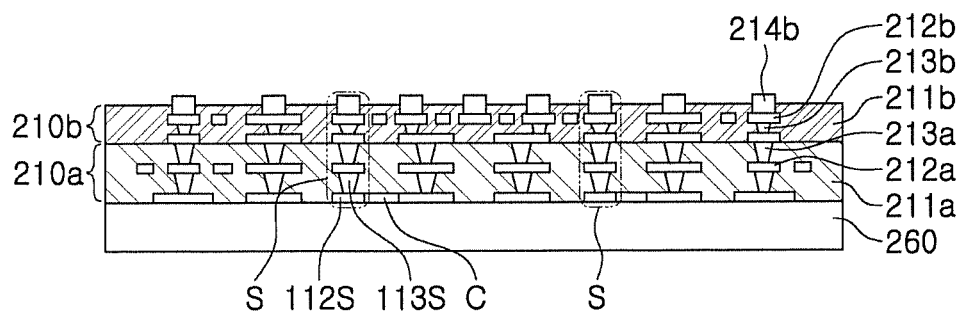

Next, as illustrated in FIG. 14, a second wiring part 210b may be formed on the first wiring part 210a. Similar to the first wiring part 210a, the second wiring part 210b may include an insulating layer 211b, conductive patterns 212b, and conductive vias 213b, and electrical testing wirings S for performing an electrical test may be formed in a state in which they are connected to the first wiring part 210a. The second wiring part 210b, which is disposed more closely to an electronic component as compared to the first wiring part 210a, may be utilized as a redistribution layer. To this end, the smallest interval between the conductive patterns 212b included in the second wiring part 210b may be smaller than the smallest interval between the conductive patterns 212a included in the first wiring part 210a. To this end, materials of the insulating layers 211a and 211b each included in the first and second wiring parts 210a and 210b may be different from each other. In a case of the second wiring part 210b in which fine patterns need to be formed, the insulating layer 211b may be formed of a photo-curable material so that a photolithography process may be used. The insulating layer 211a included in the first wiring part 210a may be formed of the same material as that of the insulating layer 211b of the second wiring part 210b. However, the insulating layer 211a included in the first wiring part 210a may be formed of a material different from that of the insulating layer 211b of the second wiring part 210b in consideration of other characteristics of the electronic component package. For example, the insulating layer 211a included in the first wiring part 210a may be formed of a material including pre-preg or ABF in consideration of warpage rigidity characteristics, or the like.

Meanwhile, unlike the exemplary embodiment described above, in the present exemplary embodiment, electrode pads 214b having a protruding form have been used. The insulating layer 211b may be etched at an appropriate thickness in order to obtain the electrode pads 214b having the protruding form. It may be appropriate in forming fine patterns to use electrode pads having an embedded form, and in a case of using the electrode pads having the protruding form, close adhesion between the electrode pad and the electronic component may be improved. Therefore, electrode pads having an appropriate form, if necessary, may be used.

Next, although not separately illustrated, also in the present exemplary embodiment, the electrical test may be performed through an upper portion of the second wiring part 210b, as described above with reference to FIG. 6. When it is determined that a defect is present in at least one of the first and second wiring parts 210a and 210b in the present test process, a subsequent process may not be performed, and thus process efficiency may be increased.

Figure 15:
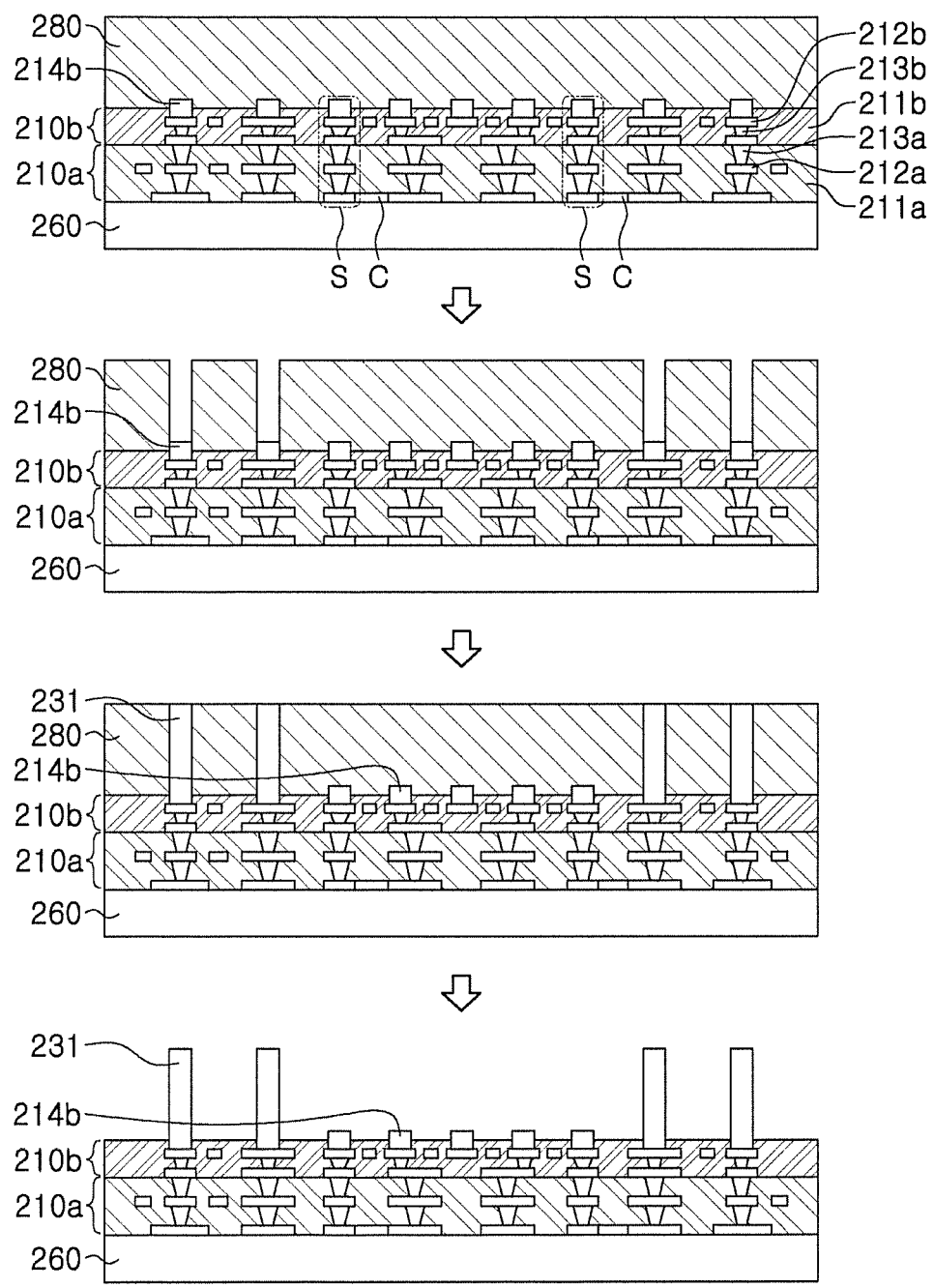

As illustrated in FIG. 15, conductive posts 231 may be formed. A process of forming the conductive posts 231 will be described in more detail. First, a mask layer 280 such as a DFR film may be formed on the wiring parts 210a and 210b, and regions in which the conductive posts are to be formed may be removed. Then, the removed regions may be filled by a process such as a plating process, a sputtering process, a paste applying process, or the like, to form the conductive posts 231. Then, the mask layer 280 may be removed. Therefore, a region in which the electronic component is mounted may be provided. In addition, similar to the exemplary embodiment described above, the electrical test for the wiring parts 210a and 210b, and the like, may be performed through the conductive posts 231 after the conductive posts 231 are formed, if necessary.

Figure 16:
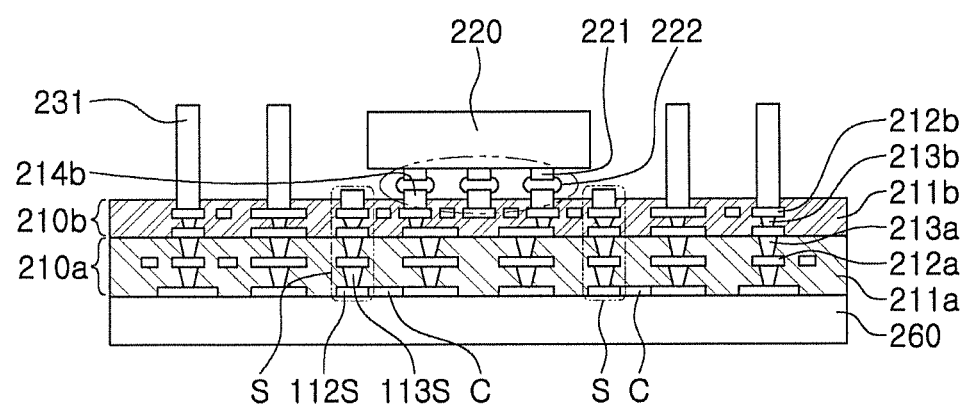

Then, as illustrated in FIG. 16, an electronic component 220 including electrode pads 221 may be mounted on the wiring parts 210a and 210b, and may be bonded to the wiring parts by applying a conductive adhesive 222 between the electrode pads 221 and 214b.

Figure 17:
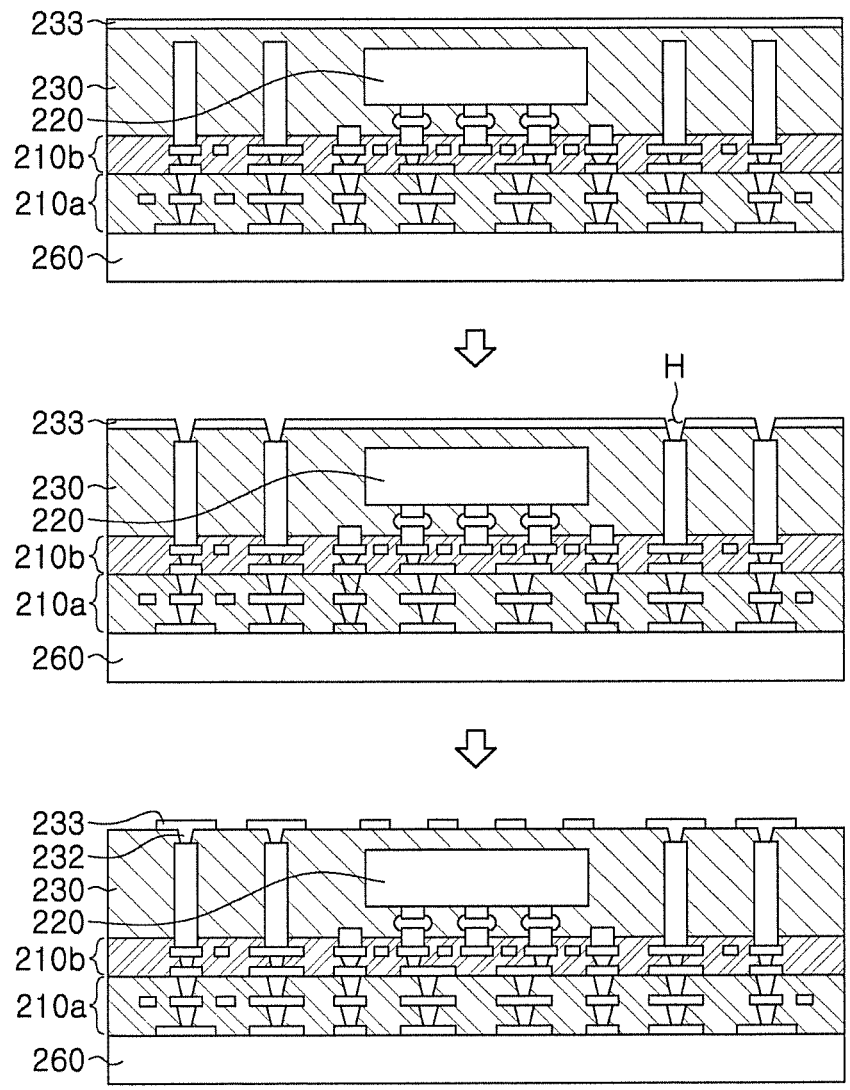

Next, as illustrated in FIG. 17, an encapsulant 230 may be formed. In this case, as described above, a resin coated copper (RCC) in a non-hardened state may be used. After the encapsulant 230 is formed, a conductive structure for electrical connection to an additional electronic component, or the like, mounted later may be formed. To this end, a method of partially removing the encapsulant 230 to form holes H exposing the conductive posts 231 and then forming conductive vias 232 connecting conductive patterns 233 and the conductive posts 231 to each other may be used.

Figure 18:
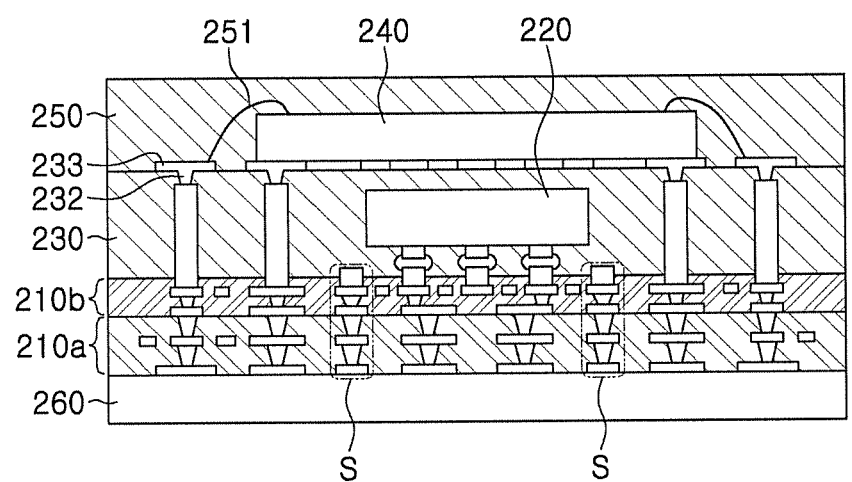

Next, as illustrated in FIG. 18, an additional or second electronic component 240 may be disposed on the encapsulant 230, and an additional or second encapsulant 250 covering the additional or second electronic component 240 may be formed. However, the present process may be omitted. That is, a subsequent process may be performed in a state in which the additional electronic component 240 and the additional encapsulant 250 are not formed. Then, similar to the exemplary embodiment described above, the support 260 may be removed, and connection parts, which are testing patterns connected to other conductive patterns 212a, may be removed so as to electrically isolate the electrical testing wirings S. Then, similar to the exemplary embodiment described above, an outer layer and connection terminals may be formed, whereby a package structure may be obtained.

As set forth above, according to an exemplary embodiment in the present disclosure, the electronic component package may have a compact size, and may have high utilization even in a case in which a plurality of electronic components are used. In addition, the electrical test may be performed before the electronic component is mounted, whereby manufacturing efficiency may be significantly improved. Further, the electronic component package described above may be efficiently manufactured by the method of manufacturing an electronic component package according to an exemplary embodiment in the present disclosure.

While exemplary embodiments have been shown and described above, it will be apparent to those skilled in the art that modifications and variations could be made without departing from the scope of the present invention as defined by the appended claims.

What is claimed is:

1. An electronic component package comprising:
    a wiring part including:
        a plurality of insulating layers,
        a signal transferring wiring including a plurality of first conductive patterns disposed on the plurality of insulating layers, and first vias penetrating through the plurality of insulating layers and electrically connecting the plurality of first conductive patterns to each other, and
        an electrical testing wiring electrically isolated from the signal transferring wiring, and including a plurality of second conducive patterns disposed on the plurality of insulating layers and second vias penetrating through the plurality of insulating layers and electrically connecting the plurality of second conductive patterns to each other;
    an electronic component disposed on the wiring part, electrically connected to the signal transferring wiring, and electrically isolated from the electrical testing wiring; and
    an encapsulant disposed on the wiring part and encapsulating the electronic component,
    wherein an uppermost portion of the signal transferring wiring is partially embedded in the encapsulant, and
    an uppermost portion of the electrical testing wiring is partially embedded in the encapsulant, and an upper surface of the uppermost portion of the electrical testing wiring is entirely directly contacted with the encapsulant.

2. The electronic component package of claim 1, wherein the wiring part includes a first wiring part and a second wiring part between the first wiring part and the electronic component, and a smallest interval between conductive patterns included in the second wiring part is smaller than a smallest interval between conductive patterns included in the first wiring part.

3. The electronic component package of claim 2, wherein materials of insulating layers respectively included in the first and second wiring parts are different from each other.

4. The electronic component package of claim 1, further comprising a conductive post at least partially embedded in the encapsulant and disposed on the signal transferring wiring and electrically connected to the electronic component through the wiring part.

5. The electronic component package of claim 4, wherein the conductive post is interposed between a via formed thereon and a via of the wiring part which is electrically connected to the electronic component, and
    a size of the via formed on the conductive post and a size of the via of the wiring part which is electrically connected to the electronic component both increase in a direction from the wiring part towards the encapsulant.

6. The electronic component package of claim 1, wherein the electrical testing wiring is not disposed between any electrode pads of the electronic component.

7. The electronic component package of claim 1, further comprising an outer layer completely covering a lower surface of a lowermost portion of the electrical testing wiring and having an opening partially exposing a lowermost portion of the signal transferring wiring.

8. The electronic component package of claim 7, further comprising a connection terminal disposed in the opening of the outer layer and electrically connected to the lowermost portion of the signal transferring wiring.

9. The electronic component package of claim 1, further comprising an electrically conductive adhesive electrically connecting a conductive pattern of the wiring part and an electrode pad of the electronic component to each other.

10. The electronic component package of claim 1, wherein the electrical testing wiring is disposed closer to the electronic component than the signal transferring wiring disposed on an edge of the electronic component package.

11. The electronic component package of claim 1, wherein any electronic component in the electronic component package is electrically isolated from the electrical testing wiring.

12. The electronic component package of claim 1, wherein a width of each of the first vias increases in a direction from the wiring part towards the encapsulant, and
    a width of each of the second vias increases in the direction from the wiring part towards the encapsulant.

13. An electronic component package comprising:
    a wiring part including:
        a plurality of insulating layers,
        a signal transferring wiring including a plurality of first conductive patterns disposed on the plurality of insulating layers, and first vias penetrating through the plurality of insulating layers and electrically connecting the plurality of first conductive patterns to each other, and
        an electrical testing wiring electrically isolated from the signal transferring wiring, and including a plurality of second conducive patterns disposed on the plurality of insulating layers and second vias penetrating through the plurality of insulating layers and electrically connecting the plurality of second conductive patterns to each other;
    an electronic component disposed on the wiring part, electrically connected to the signal transferring wiring, and electrically isolated from the electrical testing wiring;
    an outer layer completely covering a lower surface of a lowermost portion of the electrical testing wiring, and having an opening partially exposing a lowermost portion of the signal transferring wiring; and
    a connection terminal disposed in the opening of the outer layer and electrically connected to the lowermost portion of the signal transferring wiring.

14. The electronic component package of claim 13, wherein the electrical testing wiring is disposed closer to the electronic component than the signal transferring wiring disposed on an edge of the electronic component package.

15. The electronic component package of claim 13, wherein any electronic component in the electronic component package is electrically isolated from the electrical testing wiring.

16. The electronic component package of claim 13, further comprising an encapsulant disposed on the wiring part and encapsulating the electronic component, wherein the encapsulant is in direct contact with the signal transferring wiring and the electrical testing wiring.

17. The electronic component package of claim 13, wherein a width of each of the first vias increases in a direction from the outer layer towards the wiring part, and a width of each of the second vias increases in the direction from the outer layer towards the wiring part.

* * * * *